United States Patent [19]
Ueno

[11] Patent Number: 5,113,087
[45] Date of Patent: May 12, 1992

[54] OUTPUT CIRCUIT

[75] Inventor: Masaji Ueno, Yokohama, Japan

[73] Assignee: Kabushiki Kaisha Toshiba, Kawasaki, Japan

[21] Appl. No.: 723,662

[22] Filed: Jun. 26, 1991

Related U.S. Application Data

[63] Continuation of Ser. No. 382,384, Jul. 20, 1989, abandoned.

[30] Foreign Application Priority Data

Jul. 22, 1988 [JP] Japan .................. 63-182943

[51] Int. Cl.$^5$ .................. H03K 5/12
[52] U.S. Cl. .................. 307/263; 307/270; 307/443; 307/446; 307/296.7; 307/570
[58] Field of Search ........... 307/263, 264, 270, 296.7, 307/446, 555, 560, 570, 443

[56] References Cited

U.S. PATENT DOCUMENTS

| | | | |
|---|---|---|---|
| 4,477,735 | 10/1984 | Gollinger et al. | 307/270 |
| 4,491,747 | 1/1985 | Shimizu | 307/446 |
| 4,504,779 | 3/1985 | Haman | 323/349 |
| 4,634,893 | 1/1987 | Craycraft et al. | 307/263 |
| 4,703,204 | 10/1987 | Pham | 307/446 |
| 4,812,683 | 3/1989 | Fitzpatrick et al. | 307/446 |
| 4,855,624 | 8/1989 | Kertis et al. | 307/446 |

FOREIGN PATENT DOCUMENTS

| | | |
|---|---|---|
| 0068884 | 1/1983 | European Pat. Off. |
| 0150633 | 8/1985 | European Pat. Off. |
| 0177338 | 4/1986 | European Pat. Off. ............ 307/446 |
| 0090626 | 7/1981 | Japan .................. 307/446 |

OTHER PUBLICATIONS

L. Forbes: "Automatic On-Chip Threshold Voltage Compensation," IBM Technical Disclosure Bulletin, vol. 14, No. 10, Mar. 1972, pp. 2894–2895.

Primary Examiner—Stanley D. Miller
Assistant Examiner—Terry D. Cunningham
Attorney, Agent, or Firm—Finnegan, Henderson, Farabow, Garrett & Dunner

[57] ABSTRACT

An output circuit for obtaining stable rising and falling characteristics regardless of variations in threshold voltages of output transistors. The output circuit obtains such favorable characteristics by using input signals changing in a complementary manner, a first MOS transistor which outputs a high potential level signal in response to a drive signal, and an output terminal for receiving the high potential level signal. In addition, the output circuit contains a drain-current control connected to a gate-source path for maintaining a drain current at a predetermined value, a second MOS transistor connected to a gate-source path which sets the output terminal at a ground level when it is turned on, and a second drain current control connected to a gate source of the second MOS transistor for maintaining a drain current at a predetermined value.

9 Claims, 2 Drawing Sheets

OUTPUT CIRCUIT

This application is a continuation of application Ser. No. 07/382,384 filed Jul. 20, 1989, now abandoned.

BACKGROUND OF THE INVENTION

1. Field of the Invention

The present invention relates to a high breakdown voltage output circuit for shifting a level of a low-voltage output signal to output a high-voltage output signal.

2. Description of the Related Art

In general, since an IC for driving a light-emitting display such as an electroluminescence (EL) display or a plasma display panel (PDP) requires a high drive voltage, drive ICs having high breakdown voltage characteristics have been used. In an output circuit in the drive IC, high breakdown voltage characteristics, a short switching time, and low power consumption have been demanded. For this reason, a CMOS circuit is used to receive an input signal and output a low-voltage signal, and a high-voltage signal obtained by shifting the level of the low-voltage signal is output from a push-pull output stage.

FIG. 1 is a circuit diagram showing a conventional output circuit used for the above-mentioned drive IC. A CMOS inverter 33 is inserted between a low-voltage power source $V_{DD}$ and a ground voltage $V_{SS}$. The CMOS inverter 33 includes a p-channel MOS transistor 31 and an n-channel MOS transistor 32, and receives an input signal In. The emitter of a high breakdown voltage pnp transistor 34 is connected to a high-voltage power source $V_{CC}$. The transistor 34 has a multicollector structure. One collector of the transistor 34 is connected to its base. The base of the pnp transistor 34 is connected to the drain of an n-channel DMOS (double diffused MOS) transistor 35, the gate of which is connected to an output node of the CMOS inverter 33, and the source of which is connected to the ground voltage $V_{SS}$. The other collector of the pnp transistor 34 is connected to the drain of an output pull-down n-channel DMOS transistor 36. The gate of the transistor 36 receives the input signal In, and the source of the transistor 36 is connected to the ground voltage $V_{SS}$. In addition, the other collector of the transistor 34 is connected to the gate of an output pull-up n-channel DMOS transistor 37. The drain of the transistor 37 is connected to the high-voltage power source $V_{CC}$. An anode-cathode path of a Zener diode 38 is connected to a gate-source path of the transistor 37. An output signal Out is output from the source of the n-channel DMOS transistor 37.

In the circuit with the above arrangement, when the input signal In is set at "L" level, the transistor 31 in the CMOS inverter 33 is turned on, and the transistor 32 is turned off. Therefore, a signal set at $V_{DD}$ level is output from the output terminal of the CMOS inverter 33, and the transistor 35 is turned on. Therefore, the level shift transistor 34 is turned on, and a voltage drop occurs across the Zener diode 38 in response to this ON current, thus turning on the transistor 37. As a result, the output signal Out goes to "H", i.e., $V_{CC}$ level.

When the input signal In is set at "H" level, the transistor 31 in the CMOS inverter 33 is turned off, the transistor 32 is turned on, the transistor 35 is turned off, and the transistor 34 is turned off. Therefore, the transistor 37 is turned off. On the other hand, the input signal In is set at "H" level, so that the transistor 36 is turned on, and the output signal Out goes to "L" level.

In the circuit shown in FIG. 1, a voltage $V_{GS}$ of the gate-source path of the output pull-up transistor 37 is determined in accordance with a Zener voltage $V_Z$ of the Zener diode 38. When the Zener voltage $V_Z$ is set so that the voltage $V_{GS}$ exceeds a threshold voltage Vth of the transistor 37, the transistor 37 is turned on. A drain current ID of the MOS transistor 37 is defined as follows:

$$I_D = \frac{\mu \cdot \epsilon_{OX} \cdot \epsilon_O \cdot W}{t_{OX} \cdot L} \cdot \frac{(V_{GS} - Vth)^2}{2}$$

where $\mu$ is mobility of electrons, $\epsilon_{OX}$ is a dielectric constant of a gate oxide film in the transistor 37, $t_{OX}$ is a thickness of the gate oxide film, W is a channel width, L is a channel length, and $\epsilon_O$ ($=8.854 \times 10^{-14}$ F/cm) is a vacuum dielectric constant.

Thus, the drain current $I_D$ exhibits square characteristics. Therefore, when the threshold voltages Vth of the transistor 37 are varied, the value of the drain current $I_D$ is largely changed. Similarly, a variation in threshold voltage of the output pull-down transistor 36 causes a change in drain current. Thus, in the manufacturing process, a desired threshold voltage of the transistor to be formed on a semiconductor chip is deviated from a threshold voltage of the transistor which was manufactured in practice. As a result, the drain current of the output transistor is changed, and saturation voltages of the output transistor are varied. Therefore, in this output circuit which operates in a saturation region of the output transistor, a delay of output rise time is different from that of output fall time.

Thus, in the conventional output circuit, when the threshold voltages of the output transistor are varied, a drain current of the output transistor is changed. Therefore, stable rising and falling characteristics cannot be obtained.

SUMMARY OF THE INVENTION

It is an object of the present invention to provide an output circuit which can obtain stable rising and falling characteristics regardless of a variation in threshold voltages of an output transistor which is manufactured in manufacturing process.

There is provided an output circuit according to the present invention comprising an input terminal, a first MOS transistor, the gate of which receives a first control signal from the input terminal, a first level shift transistor, the base of which is connected to the drain of the first MOS transistor, and the emitter of which is connected to a first potential, second and third MOS transistors, each gate of which receives a second control signal having a phase opposite to that of the first control signal from the input terminal, a second level shift transistor, the emitter of which is connected to the first potential, and the base of which is connected to the drain of the second MOS transistor, a fourth MOS transistor, the gate and drain of which are connected to the drain of the third MOS transistor, and the drain of the fourth MOS transistor being connected to the collector of the first level shift transistor, a fifth MOS transistor, the gate of which is connected to the drain of the fourth MOS transistor and the collector of the first level shift transistor, and the drain of which is connected to the collector of the second level shift transistor, a sixth output MOS transistor, the drain of which is connected to the first potential, and the gate of which is connected to the collector of the second level shift transistor, a seventh MOS transistor, the gate of which is connected to the collector of the second level shift transistor, the drain of which is connected to the collector of the second level shift transistor, and the source of which is connected to the source of the sixth MOS transistor, a constant voltage control element connected to the gate and source of the sixth MOS transistor, and an output terminal which is connected to the source of the sixth MOS transistor and from which an output is extracted.

In the output circuit according to the present invention, as described above, the seventh MOS transistor is arranged between the gate and source of the sixth output MOS transistor. Therefore, when the threshold voltage of the sixth MOS transistor is changed, the threshold voltage of the seventh MOS transistor is changed to cancel the change in threshold voltage of the sixth MOS transistor.

In the output circuit according to the present invention, as described above, the fourth MOS transistor is arranged between the gate and source of the fifth MOS transistor. Therefore, when the threshold value of the fifth MOS transistor is changed, the threshold voltage of the fourth MOS transistor is changed to cancel the change threshold voltage of the fifth MOS transistor.

A change in threshold voltages of the fifth and sixth MOS transistors, therefore, does not affect drain currents of the fifth and sixth MOS transistors.

In the output circuit according to the present invention, therefore, stable rising and falling characteristics can be obtained.

DETAILED DESCRIPTION OF THE PREFERRED EMBODIMENT

An embodiment of the present invention will be described hereinafter with reference to the accompanying drawings.

Figure 1:
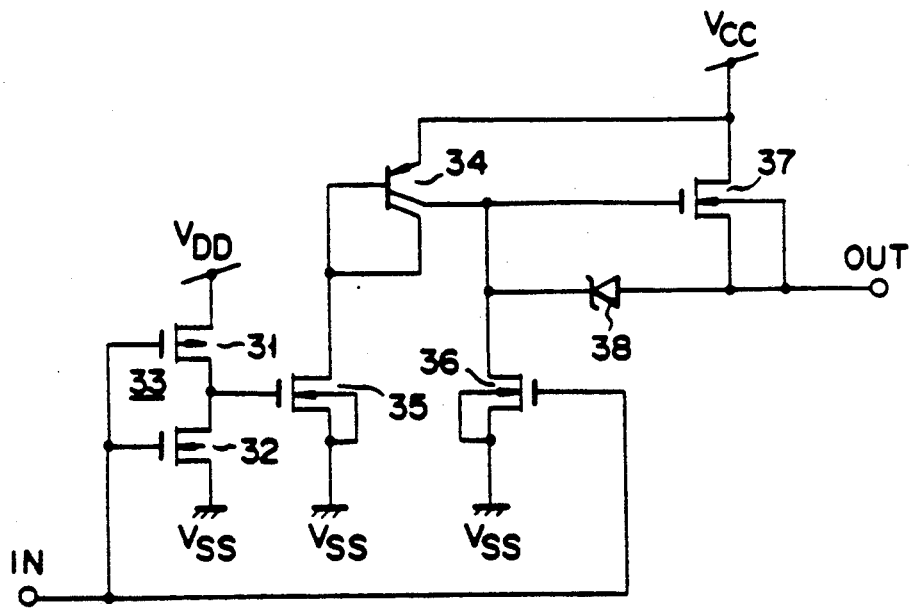
FIG. 1 is a circuit diagram showing a conventional output circuit.
Figure 2:
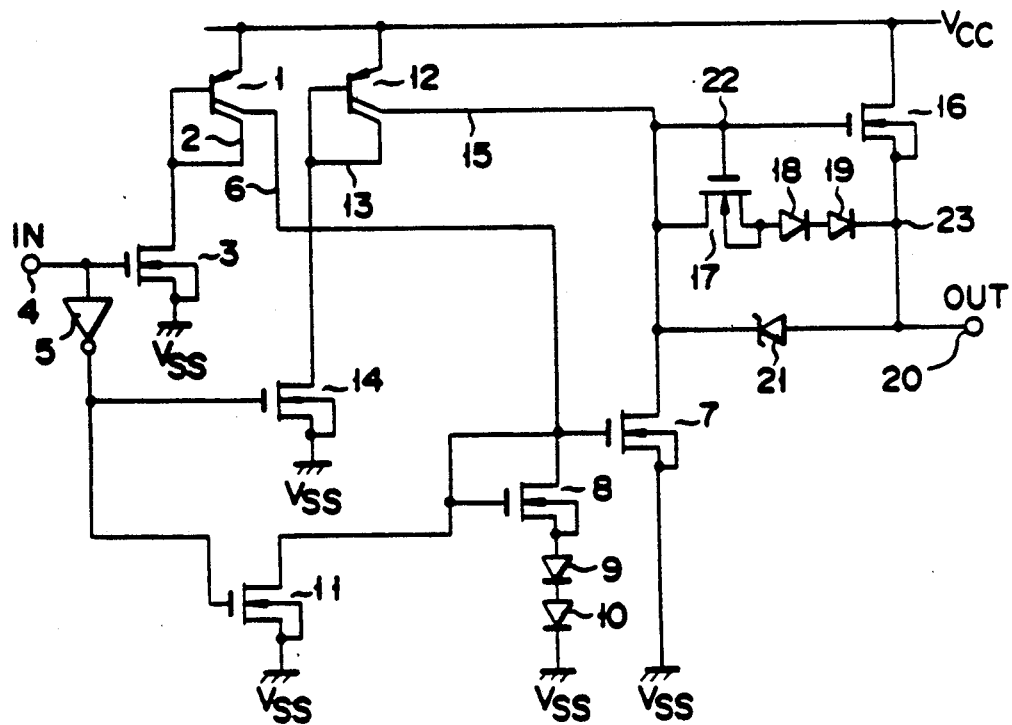
FIG. 2 is a circuit diagram showing an output circuit according to the present invention.

FIG. 2 is a circuit diagram showing an arrangement of an output circuit according to the present invention. The emitter of a high breakdown voltage pnp multi-collector transistor 1 is connected to a high-voltage power source VCC. A first collector 2 of the transistor 1 is connected to its base. The base of the transistor 1 is connected to the drain of an n-channel DMOS transistor 3. The gate of the transistor 3 is connected to an input terminal 4 for receiving an input signal In. The source of the transistor 3 is connected to a ground voltage VSS. The input terminal of an inverter 5 operated by a low-voltage power source VDD is connected to the input terminal 4.

A second collector 6 of the transistor 1 is connected to the gate of an n-channel DMOS transistor 7. The gate of the transistor 7 is connected to the output terminal of the inverter 5 through an n-channel DMOS transistor 11. The source of the transistor 7 is connected to the ground voltage $V_{SS}$. The gate of an n-channel DMOS transistor 8 is connected to the gate of the transistor 7. In the n-channel DMOS transistor 8, the gate and the drain are connected to each other. Series-connected diodes 9 and 10 having polarities shown in FIG. 2 are inserted between the source of the transistor 8 and the ground voltage $V_{SS}$. In addition, a gate-drain path of the n-channel DMOS transistor 11, the source of which is grounded, is connected between the output terminal of the inverter 5 and the gate of the transistor 8.

The emitter of a high breakdown voltage pnp multicollector transistor 12 is connected to the high-voltage power source $V_{CC}$. A first collector 13 of the transistor 12 is connected to its base. The base of the transistor 12 is connected to the drain of an n-channel DMOS transistor 14. The gate of the transistor 14 is connected to the output terminal of the inverter 5, and the source of the transistor 14 is connected to the ground voltage $V_{SS}$.

A second collector 15 of the transistor 12 is connected to the gate of an n-channel DMOS transistor 16, the drain of which is connected to the high-voltage power source $V_{CC}$. The gate of an n-channel DMOS transistor 17 is connected to the gate of the transistor 16. In the n-channel DMOS transistor 17, the gate and the drain are connected to each other. Series-connected diodes 18 and 19 having polarities shown in FIG. 2 are connected between the source of the transistor 17 and the source of the transistor 16. The source of the transistor 16 is connected to an output terminal 20 from which an output signal OUT appears. In addition, a Zener diode 21 having polarities shown in FIG. 2 is connected between the gate of the transistor 16 and the output terminal 20. The drain of the n-channel DMOS transistor 7 is connected to the output terminal 20 through the Zener diode 21.

Since the DMOS transistors for constituting the circuit are simultaneously manufactured, their threshold voltages are constant, as a matter of course.

An operation of the circuit with the above arrangement will be described hereinafter. When the input signal IN goes to "L" level from "H" level, the transistor 3 is turned off. At this time, since the output signal from the inverter 5 goes to "H" level from "L" level, the transistor 14 is turned on. Therefore, the level shift transistor 12 is turned on, a current is supplied from the second collector 15 to the Zener diode 21, and a constant voltage drop occurs across an anodecathode path of the Zener diode 21. Therefore, a predetermined voltage drop occurs across a path between a node 22 of the gates of the transistors 16 and 17, and a node 23 of the sources of the transistors 16 and 17. The gate and drain of the transistor 17 are connected to each other. Therefore, when the transistor 17 is turned on, the voltage across the source-drain path of the transistor 17 is equal to the threshold voltage of the transistor 17. In addition, since the transistors 16 and 17 are simultaneously manufactured, their threshold voltages are equal to each other. Therefore, when the transistor 17 is turned on, a voltage drop of the threshold voltage of the transistor 17 occurs across the source-drain path of the transistor 17. Therefore, a voltage corresponding to a sum of the threshold voltage of the transistor 17 and forward drop voltages of the two diodes is applied to the gate of the transistor 16. Therefore, the transistor 16 is turned on, the output terminal 20 is charged by the high-voltage power source $V_{CC}$, and the output signal OUT goes to $V_{CC}$ level. In addition, when the transistor 11 is turned on, a parasitic capacitance of the gate-source path of the transistor 7 is discharged to the ground potential $V_{SS}$ side, and the transistor 7 which has been turned on in advance is abruptly turned off.

When the input signal IN goes to "H" level from "L" level, the transistor 3 is turned on. At this time, since the output signal from the inverter 5 goes to "L" level from "H" level, the transistor 14 is turned off, and the level shift transistor 12 is turned off. In addition, the transistor 11 is turned off. The transistor 3 is turned on, so that the level shift transistor 1 is turned on. A current is supplied from the second collector 6 through the transistor 8 and the diodes 9 and 10. A voltage drop corresponding to a sum of the threshold voltage of the transistor 8 and forward drop voltages of the two diodes occurs across the gate-source path of the transistor 7, and the transistor 7 is turned on. Therefore, a parasitic capacitance of the output terminal 20 is discharged to the ground potential $V_{SS}$ side, and the output signal OUT is set at the ground potential $V_{SS}$. At this time, since a parasitic capacitance at the node 22 of the gate of the transistor 16 is discharged through the transistor 7, the transistor 16 is abruptly turned off.

In the circuit according to the above-mentioned embodiment, a voltage $V_{GS11}$ across the gate-source path of the output pull-up transistor 16 is a sum of a voltage $V_{GS21}$ across the gate-source path of the transistor 17 and a voltage $2V_{F1}$ across the p-n junction of the diodes 18 and 19, and is defined as follows:

$$V_{GS11} = V_{GS21} + 2V_{F1} \qquad (2)$$

Similarly, a voltage $V_{GS12}$ across the gate-source path of the output pull-down transistor 7 is a sum of a voltage $V_{GS22}$ across the gate-source path of the transistor 8 and a voltage $2V_{F2}$ of the p-n junction of the diodes 9 and 10, and is defined as follows:

$$V_{GS12} = V_{GS22} + 2V_{F2} \qquad (3)$$

Assuming that the Zener diode 21 generates a Zener voltage $V_Z$, a current which satisfies the following condition must be supplied from the level shift transistor 12:

$$V_Z > V_{GS21} + 2V_{F1} \qquad (4)$$

With the above circuit arrangement, when the output pull-up and pull-down transistors 16 and 17 are turned on, the voltages corresponding to their threshold voltages are generated by the transistors 17 and 18, and the resultant voltages are respectively applied to the gates of the transistors 16 and 17. Therefore, a variation in threshold voltages does not affect the drain currents from the output transistors, and constant output currents can be obtained. Therefore, rise and fall time delays of the output signal Out are constant, thus obtaining stable characteristics.

Figure 3:
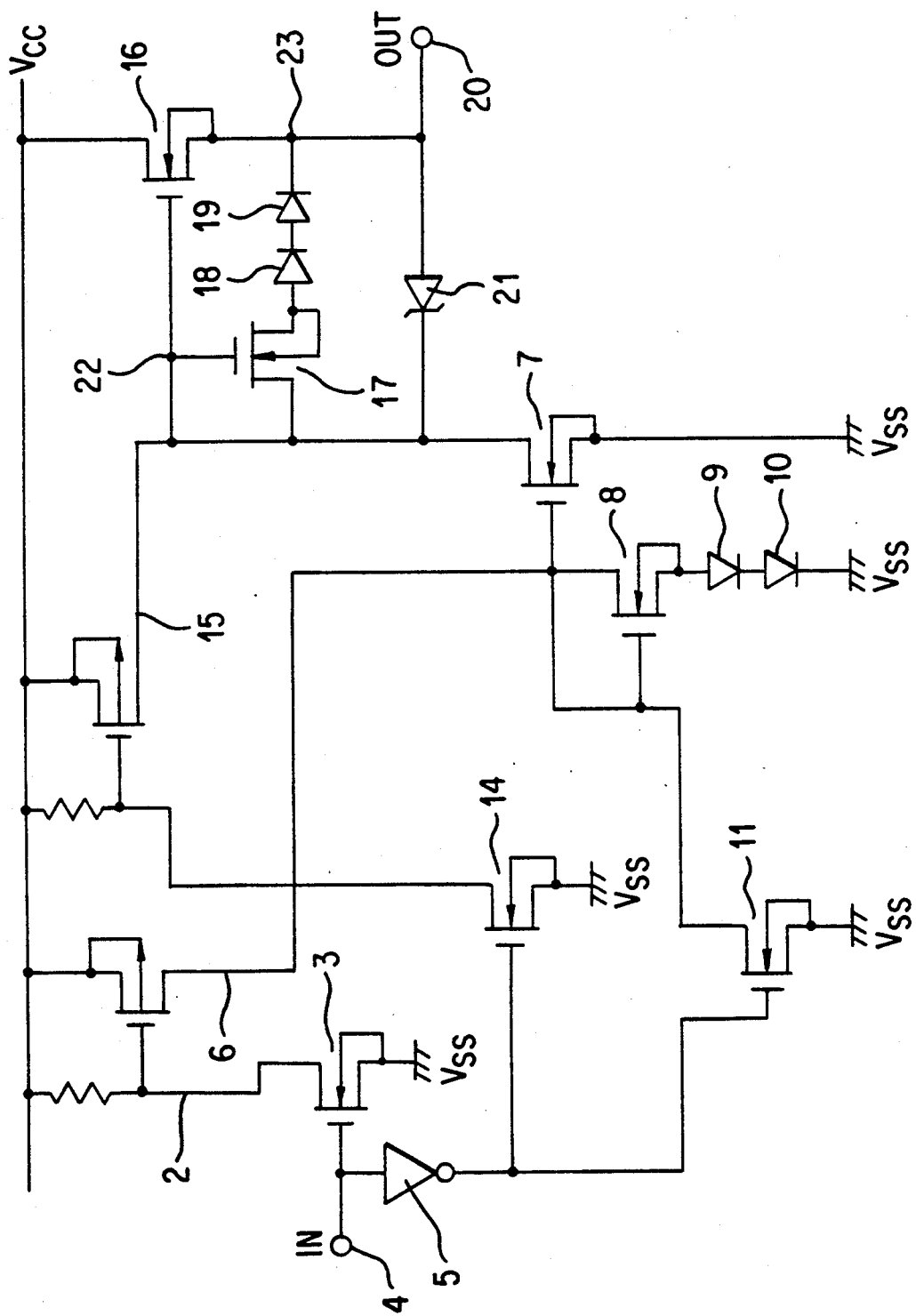
FIG. 3 is a circuit diagram showing another embodiment of the circuit according to the present invention.

Note that various changes and modifications of the circuit according to this invention can be made. For example, although a high breakdown voltage bipolar transistor is used as a level shift circuit in the circuit of this embodiment, a high breakdown voltage MOS field effect transistor can be used as shown in FIG. 3. In addition, a circuit for outputting a signal for controlling such an output circuit is not limited to a specific one.

What is claimed is:

1. An output circuit comprising:
   input signal supply means for simultaneously outputting first and second signals from two output nodes, said first and second signals having different levels which change in a complementary manner;
   first and second switching means which are turned on and off in a complementary manner upon receipt of the first and second signals, respectively, supplied from said input signal supply means;
   first level shift means connected between said first switching means, and a high potential level, for outputting a first drive signal when said first switching means is turned on upon receipt of the first signal;
   first MOS transistor having a drain coupled to said high potential level, and a gate coupled to receive the first drive signal supplied from said first level shift means;
   an output terminal coupled to a source of said first MOS transistor;
   first drain-current control means connected between said gate-source path of said first MOS transistor, for maintaining a drain current of said first MOS transistor at a predetermined value;
   second level shift means connected between said second switching means and said high potential level, for outputting a second drive signal when said second switching means is turned on upon receipt of the second signal;
   second MOS transistor having a gate coupled to receive the second drive signal supplied from said second level shift means, and having a drain and source respectively connected to said output terminal and a ground level; and
   second drain current control means connected between said gate-source of said second MOS transistor, for maintaining a drain current of said second MOS transistor at a predetermined value.

2. A circuit according to claim 1, wherein said first and second level shift means are high breakdown voltage bipolar transistors.

3. A circuit according to claim 1, wherein said first and second level shift means are high breakdown voltage MOS field effect transistors.

4. The circuit according to claim 1, wherein said input signal supply means comprises an input terminal and an inverter.

5. The circuit according to claim 1, wherein said first and second switching means are MOS transistors.

6. The circuit according to claim 1, wherein said first drain current control means comprises third MOS transistor, a drain and gate of which are connected to the gate of said first MOS transistor and said first level shift means, and a plurality of diodes arranged between a source of said third MOS transistor and the source of said first MOS transistor.

7. The circuit according to claim 1, wherein said second drain-current control means comprises fourth MOS transistor, a drain and gate of which are connected to the gate of said second MOS transistor and said second level shift means, and a plurality of diodes arranged between a source of said fourth MOS transistor and said ground potential.

8. The circuit according to claim 1, further comprising fifth MOS transistor, a gate of which is connected to said input signal supply means, a source of which is connected to said ground potential, and a drain of which is connected to the gate of said second MOS transistor and is turned on upon receipt of the first signal, thereby to discharge a parasitic capacitance of the gate-source path of said second MOS transistor.

9. The circuit according to claim 1, which further comprises a Zener diode connected between the gate and source of said first MOS transistor.

* * * * *

UNITED STATES PATENT AND TRADEMARK OFFICE
CERTIFICATE OF CORRECTION

PATENT NO. : 5,113,087
DATED : May 12, 1992
INVENTOR(S) : Masaji Ueno

It is certified that error appears in the above-identified patent and that said Letters Patent is hereby corrected as shown below:

item [54] and col. 1, line 2,

Title Page, Title, change "OUPUT CIRCUIT" to --AN OUTPUT CIRCUIT FOR OBTAINING STABLE RISING AND FALLING CHARACTERISTICS--.

Claim 1, column 6, line 6, after "means" delete ",".

Signed and Sealed this

Ninth Day of November, 1993

Attest:

BRUCE LEHMAN

Attesting Officer

Commissioner of Patents and Trademarks